(12) United States Patent
Van De Ven

(10) Patent No.: US 8,950,910 B2
(45) Date of Patent: Feb. 10, 2015

(54) LIGHTING DEVICE AND METHOD OF COOLING LIGHTING DEVICE

(75) Inventor: Antony Paul Van De Ven, Sai Kung (CN)

(73) Assignee: Cree, Inc., Durham, NC (US)

( * ) Notice: Subject to any disclaimer, the term of this patent is extended or adjusted under 35 U.S.C. 154(b) by 344 days.

(21) Appl. No.: 12/411,905

(22) Filed: Mar. 26, 2009

(65) Prior Publication Data

US 2010/0246177 A1   Sep. 30, 2010

(51) Int. Cl.
| F21V 29/00 | (2006.01) |
| F21S 8/10 | (2006.01) |
| F21V 29/02 | (2006.01) |
| F21Y 101/02 | (2006.01) |

(52) U.S. Cl.
CPC ............ F21S 48/325 (2013.01); F21V 29/027 (2013.01); F21Y 2101/02 (2013.01); F21V 29/248 (2013.01)
USPC .......................................... 362/373; 362/294

(58) Field of Classification Search
USPC ............. 362/294, 373, 96, 547, 249.02, 580, 362/126, 345, 218, 264, 800; 257/E23.08, 257/E23.097–E23.099
See application file for complete search history.

(56) References Cited

U.S. PATENT DOCUMENTS

| 1,609,412 A * | 12/1926 | Kolisch .......................... 392/379 |
| 4,302,160 A * | 11/1981 | Hofmann, Jr. ................. 417/313 |
| 4,918,487 A | 4/1990 | Coulter, Jr. |
| 5,631,190 A | 5/1997 | Negley |
| 5,890,794 A * | 4/1999 | Abtahi et al. .................. 362/294 |
| 5,912,477 A | 6/1999 | Negley |
| 6,600,175 B1 | 7/2003 | Baretz et al. |
| 7,114,135 B1 | 9/2006 | Gauvin |
| 7,144,140 B2 * | 12/2006 | Sun et al. ....................... 362/373 |
| 7,213,940 B1 | 5/2007 | Van de Ven |
| 7,234,224 B1 | 6/2007 | Naugler et al. |
| 7,234,844 B2 * | 6/2007 | Bolta et al. ..................... 362/294 |
| 7,309,145 B2 * | 12/2007 | Nagata et al. .................. 362/294 |
| 7,766,514 B2 * | 8/2010 | Chen .............................. 362/294 |
| 8,434,238 B2 * | 5/2013 | Gross et al. ......................... 34/96 |
| 2003/0021113 A1 * | 1/2003 | Begemann ..................... 362/231 |
| 2005/0168990 A1 * | 8/2005 | Nagata et al. .................. 362/294 |
| 2006/0193139 A1 * | 8/2006 | Sun et al. ....................... 362/373 |
| 2007/0137074 A1 | 6/2007 | Van de Ven |

(Continued)

FOREIGN PATENT DOCUMENTS

| CN | 200965218 | 10/2007 |
| CN | 201190986 Y | 2/2009 |

(Continued)

OTHER PUBLICATIONS

U.S. Appl. No. 12/582,206, filed Oct. 20, 2009, Pickard.

(Continued)

*Primary Examiner* — Bao Q Truong
(74) *Attorney, Agent, or Firm* — Burr & Brown, PLLC

(57) ABSTRACT

A lighting device comprising a solid state light emitter and a fan, the fan blowing fluid toward the emitter. A lighting device comprising a solid state light emitter and a baffle, the solid state light emitter being movable. A lighting device comprising a solid state light emitter, a substrate and a diaphragm, the diaphragm defining a chamber having a valve and being movable. A lighting device comprising a housing and a solid state light emitter within the housing, the solid state light emitter being movable. Also, methods of cooling a lighting device.

11 Claims, 3 Drawing Sheets

(56) References Cited

U.S. PATENT DOCUMENTS

| | | |
|---|---|---|
| 2007/0139923 A1 | 6/2007 | Negley |
| 2007/0170447 A1 | 7/2007 | Negley |
| 2007/0171145 A1 | 7/2007 | Coleman |
| 2007/0189012 A1* | 8/2007 | Huang et al. .................. 362/294 |
| 2007/0195527 A1* | 8/2007 | Russell ......................... 362/240 |
| 2007/0236911 A1 | 10/2007 | Negley |
| 2007/0263393 A1 | 11/2007 | Van de Ven |
| 2007/0274063 A1 | 11/2007 | Negley |
| 2007/0274080 A1 | 11/2007 | Negley |
| 2007/0278934 A1 | 12/2007 | Van de Ven |
| 2007/0279440 A1 | 12/2007 | Negley |
| 2007/0279903 A1 | 12/2007 | Negley |
| 2007/0280624 A1 | 12/2007 | Negley |
| 2008/0084685 A1 | 4/2008 | Van de Ven |
| 2008/0084700 A1 | 4/2008 | Van de Ven |
| 2008/0084701 A1 | 4/2008 | Van de Ven |
| 2008/0088248 A1 | 4/2008 | Myers |
| 2008/0089053 A1 | 4/2008 | Negley |
| 2008/0106895 A1 | 5/2008 | Van de Ven |
| 2008/0106907 A1 | 5/2008 | Trott |
| 2008/0112168 A1 | 5/2008 | Pickard |
| 2008/0112170 A1 | 5/2008 | Trott |
| 2008/0112183 A1 | 5/2008 | Negley |
| 2008/0137347 A1 | 6/2008 | Trott |
| 2008/0278950 A1 | 11/2008 | Pickard |
| 2008/0278952 A1 | 11/2008 | Trott |
| 2008/0278957 A1 | 11/2008 | Pickard |
| 2008/0285298 A1* | 11/2008 | Shuy ............................ 362/547 |
| 2008/0304261 A1 | 12/2008 | Van de Ven |
| 2008/0304269 A1 | 12/2008 | Pickard |
| 2008/0309255 A1 | 12/2008 | Myers |
| 2009/0046465 A1 | 2/2009 | Hashimoto et al. |
| 2009/0108269 A1 | 4/2009 | Negley |
| 2009/0184666 A1 | 7/2009 | Myers |
| 2010/0142212 A1* | 6/2010 | Tahmosybayat .............. 362/373 |

FOREIGN PATENT DOCUMENTS

| | | |
|---|---|---|
| DE | 10 2005 051 248 | 5/2007 |
| EP | 2 025 999 | 2/2009 |
| JP | 2000-136759 | 5/2000 |
| JP | 2004-095655 | 3/2004 |
| JP | 2004-243707 | 9/2004 |
| JP | 2007-226970 | 9/2007 |
| JP | 2007-250276 | 9/2007 |
| JP | 2008-137148 | 6/2008 |
| JP | 2009-049010 | 3/2009 |
| WO | 2009/035257 | 3/2009 |

OTHER PUBLICATIONS

U.S. Appl. No. 12/607,355, filed Oct. 28, 2009, Pickard.
U.S. Appl. No. 12/683,886, filed Jan. 7, 2010, Pickard.
U.S. Appl. No. 61/039,926, filed Mar. 27, 2008, Myers.
Chinese Office Action dated Oct. 22, 2013 (and translation provided by foreign counsel), 8 pages.
Japanese Office Action (and translation provided by foreign counsel) from a corresponding Japanese patent application bearing a mailing date of Jul. 25, 2013, 4 pages.
Japanese Office Action (and translation provided by foreign counsel) from a corresponding Japanese patent application bearing a mailing date of Jun. 3, 2014, 5 pages.
Chinese Office Action (and translation provided by foreign counsel) from a corresponding Chinese patent application bearing a mailing date of Jul. 1, 2014, 10 pages.

* cited by examiner

LIGHTING DEVICE AND METHOD OF COOLING LIGHTING DEVICE

FIELD OF THE INVENTIVE SUBJECT MATTER

The present inventive subject matter is directed to lighting devices and methods of cooling lighting devices. In some aspects, the present inventive subject matter is directed more particularly to a lighting device which comprises one or more solid state light emitters and one or more elements for cooling the solid state light emitter(s). In some aspects, the present inventive subject matter is directed more particularly to a method of cooling one or more solid state light emitters in a lighting device.

BACKGROUND

A large proportion (some estimates are as high as twenty-five percent) of the electricity generated in the United States each year goes to lighting. Accordingly, there is an ongoing need to provide lighting which is more energy-efficient. It is well known that incandescent light bulbs are very energy-inefficient light sources—about ninety percent of the electricity they consume is released as heat rather than light. Fluorescent light bulbs are more efficient than incandescent light bulbs (by a factor of about 10) but are still less efficient than solid state light emitters, such as light emitting diodes.

In addition, as compared to the normal lifetimes of solid state light emitters, e.g., light emitting diodes, incandescent light bulbs have relatively short lifetimes, i.e., typically about 750-1000 hours. In comparison, light emitting diodes, for example, have typical lifetimes between 50,000 and 70,000 hours. Fluorescent bulbs have longer lifetimes (e.g., 10,000-20,000 hours) than incandescent lights, but provide less favorable color reproduction.

Another issue faced by conventional light fixtures is the need to periodically replace the lighting devices (e.g., light bulbs, etc.). Such issues are particularly pronounced where access is difficult (e.g., vaulted ceilings, bridges, high buildings, traffic tunnels) and/or where change-out costs are extremely high. The typical lifetime of conventional fixtures is about 20 years, corresponding to a light-producing device usage of at least about 44,000 hours (based on usage of 6 hours per day for 20 years). Light-producing device lifetime is typically much shorter, thus creating the need for periodic change-outs.

Accordingly, for these and other reasons, efforts have been ongoing to develop ways by which solid state light emitters can be used in place of incandescent lights, fluorescent lights and other light-generating devices in a wide variety of applications. In addition, where light emitting diodes (or other solid state light emitters) are already being used, efforts are ongoing to provide light emitting diodes (or other solid state light emitters) which are improved, e.g., with respect to energy efficiency, efficacy (lm/W), and/or duration of service.

As is well known, in many devices where solid state light emitters are employed, one or more luminescent materials are employed. A wide variety of luminescent materials (also known as lumiphors or luminophoric media, e.g., as disclosed in U.S. Pat. No. 6,600,175, the entirety of which is hereby incorporated by reference) are well known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished in a variety of ways, one representative way being by adding the luminescent materials to a clear or transparent encapsulant material (e.g., epoxy-based, silicone-based, glass-based or metal oxide-based material) as discussed above, for example by a blending or coating process.

For example, one representative example of a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. The first resin portion can be obtained by filling the cup reflector with a resin material and curing it after the light emitting diode chip has been mounted onto the bottom of the cup reflector and then has had its cathode and anode electrodes electrically connected to the leads by way of wires. A luminescent material can be dispersed in the first resin portion so as to be excited with the light A that has been emitted from the light emitting diode chip, the excited luminescent material produces fluorescence ("light B") that has a longer wavelength than the light A, a portion of the light A is transmitted through the first resin portion including the luminescent material, and as a result, light C, as a mixture of the light A and light B, is used as illumination.

BRIEF SUMMARY OF THE INVENTIVE SUBJECT MATTER

The present inventive subject matter relates to lighting devices which comprise solid state light emitters, such as LEDs. Many solid state light emitters, however, do not operate well in high temperatures. LED light sources, for example, have operating lifetimes of decades (as opposed to just months or one or two years for many incandescent bulbs), but an LED's lifetime is usually significantly shortened if it operates at elevated temperatures. It is generally accepted that the junction temperature of an LED should not exceed 85 degrees C. if a long lifetime is desired.

In addition, the intensity of light emitted from some solid state light emitters varies based on ambient temperature. For example, LEDs which emit red light often have a very strong temperature dependence (e.g., AlInGaP LEDs can reduce in optical output by ~20% when heated up by ~40 degrees C., that is, approximately −0.5% per degree C.; and blue InGaN+ YAG:Ce LEDs can reduce by about −0.15%/degree C.).

In order to provide longer life and/or greater efficiency and/or more consistent color output for lighting devices which include one or more solid state light emitters, e.g., one or more light emitting diodes, in accordance with the present inventive subject matter, there is provided a lighting device which comprises at least one solid state light emitter in which the junction temperature of the solid state light emitter(s) is managed (so as to be kept at or near the manufacturer's recommended junction temperature) by actively cooling the solid state light emitter(s) with fluid movement or fluid cooling that is in direct contact with the solid state light emitter(s) or in close proximity to the solid state light emitter(s).

In some embodiments of the present inventive subject matter, the temperature management provided makes it possible to reduce the size of or even eliminate altogether the use of a heat sink, which can be heavy, expensive, and/or potentially unsafe (since they are typically electrically conductive), and/or which can take up space, and/or which can have a negative impact on optical performance (e.g., due to taking up space and/or causing obscuration). Accordingly, such embodiments can provide reduction in weight, reduction in size and/or reduction in cost as a result of the ability (provided by the present inventive subject matter) to eliminate heat sinks and heat spreaders normally used to move the heat from solid state light emitters to ambient by increasing the effective surface area of the interface between the thermal source and ambient, thereby allowing more heat to be transported away from the light emitter to the environment and keeping the junction temperature low.

In order to minimize the thermal resistance and maximize the surface effect, heat sinks that are typically employed tend to have thick cross-sectional areas. The thermal conductivity is proportional to the cross-sectional area and inversely proportional to the distance the heat needs to be moved. Heat sinks are also made from materials that inherently have high thermal conductivities. Such materials include metals, metal alloys, ceramics, and polymers mixed with ceramic or metal or metalloid particles. One of the more common materials in aluminum. These heat sinks, in order to be effective, are often very large in comparison to the size of the solid state light emitters. Such heat sinks add large amounts of volume, weight and cost. One the objects of some aspects of the present inventive subject matter is to provide lighter, cheaper and smaller size lighting devices by removing (or reducing) the need for a heat sink or heat spreader by causing air to move directly over/around/adjacent to the lighting device to remove the heat directly from the lighting device.

In addition, cooling the solid state light emitter(s) directly makes it possible to cool the solid state light emitter(s) more rapidly since the heat capacity of the solid state light emitter(s) is usually very small relative to a large heat sink (i.e., the heat sink stores more heat in its large mass).

According to a first aspect of the present inventive subject matter, there is provided a lighting device comprising at least one solid state light emitter and at least one fan, the solid state light emitter and the fan being positioned relative to one another and the fan being oriented such that when power is supplied to the fan, the fan blows fluid (i.e., gas and/or liquid) toward the solid state light emitter.

In some embodiments according to the first aspect of the present inventive subject matter:
the lighting device further comprises at least one substrate,
the substrate comprises at least a first surface and a second surface,
the solid state light emitter is mounted on the first surface,
the substrate comprises at least one hole extending from the first surface to the second surface, and
when power is supplied to the fan, the fan blows fluid through the hole, e.g., from adjacent the second surface to adjacent the first surface.

In some embodiments according to the first aspect of the present inventive subject matter:
the lighting device further comprises at least one nozzle having an exit orifice,
the fan and the nozzle are oriented relative to one another such that when power is supplied to the fan, the fan blows fluid through the exit orifice.

In some embodiments according to the first aspect of the present inventive subject matter, the solid state light emitter comprises at least one layer which substantially prevents liquid from passing therethrough.

In some embodiments according to the first aspect of the present inventive subject matter, the fluid comprises at least one gas, e.g., air.

In some embodiments according to the first aspect of the present inventive subject matter, the fluid comprises at least one liquid.

According to a second aspect of the present inventive subject matter, there is provided a lighting device comprising:
at least one solid state light emitter, the solid state light emitter being movable between at least a first position and a second position; and
at least one baffle.

In some embodiments according to the second aspect of the present inventive subject matter, the baffle comprises a first surface having an area which is larger than a surface area of the solid state light emitter.

In some embodiments according to the second aspect of the present inventive subject matter, the solid state light emitter comprises at least one layer which substantially prevents liquid from passing therethrough.

In some embodiments according to the second aspect of the present inventive subject matter, the fluid comprises at least one gas, e.g., air.

In some embodiments according to the second aspect of the present inventive subject matter, the fluid comprises at least one liquid.

In some embodiments according to the second aspect of the present inventive subject matter, when the solid state light emitter is moved between the first position and the second position, movement of the solid state light emitter relative to the baffle creates fluid flow, the fluid flow passing adjacent to the solid state light emitter.

In some embodiments according to the second aspect of the present inventive subject matter, the solid state light emitter is mounted on a substrate.

According to a third aspect of the present inventive subject matter, there is provided a lighting device comprising:
at least one solid state light emitter;
a substrate; and
a diaphragm, the diaphragm defining at least one chamber having at least one valve,
the solid state light emitter being mounted on the substrate,
the chamber being positioned adjacent to the substrate,
the diaphragm being movable between at least a first diaphragm position and a second diaphragm position.

In some embodiments according to the third aspect of the present inventive subject matter, a volume within the chamber is larger when the diaphragm is in the second diaphragm position than when the diaphragm is in the first diaphragm position.

In some embodiments according to the third aspect of the present inventive subject matter, the chamber is defined by an internal chamber surface, and the chamber surface comprises at least a portion of the substrate and at least a portion of an internal surface of the diaphragm.

According to a fourth aspect of the present inventive subject matter, there is provided a method of cooling a lighting device comprising supplying power to at least one fan and blowing fluid toward at least one solid state light emitter.

In some embodiments according to the fourth aspect of the present inventive subject matter:
the lighting device comprises at least one substrate,
the substrate comprises at least a first surface and a second surface,
the solid state light emitter is mounted on the first surface, the substrate comprises at least one hole extending from the first surface to the second surface, and the fan blows fluid through the hole, e.g., from adjacent the second surface to adjacent the first surface.

In some embodiments according to the fourth aspect of the present inventive subject matter:

the lighting device further comprises at least one nozzle having an exit orifice, and the fan blows fluid through the exit orifice.

In some embodiments according to the fourth aspect of the present inventive subject matter, the solid state light emitter comprises at least one layer which substantially prevents liquid from passing therethrough.

In some embodiments according to the fourth aspect of the present inventive subject matter, the method further comprises immersing the solid state light emitter and the layer in a moving flow of cooling liquid, i.e., either moving the solid state light emitter and the layer in to an already moving flow of cooling liquid, and/or moving cooling liquid so that it moves over, around and/or through the solid state light emitter and the layer.

In some embodiments according to the fourth aspect of the present inventive subject matter, the fluid comprises at least one gas, e.g., air.

In some embodiments according to the fourth aspect of the present inventive subject matter, the fluid comprises at least one liquid.

According to a fifth aspect of the present inventive subject matter, there is provided a method of cooling a lighting device comprising:

moving a solid state light emitter between a first position and a second position relative to a first baffle, creating a fluid flow due to the movement of the solid state light emitter, and flowing the fluid adjacent to the solid state light emitter.

In some embodiments according to the fifth aspect of the present inventive subject matter, the solid state light emitter is mounted on a substrate.

In some embodiments according to the fifth aspect of the present inventive subject matter, the solid state light emitter comprises at least one layer which substantially prevents liquid from passing therethrough.

In some embodiments according to the fifth aspect of the present inventive subject matter, the fluid comprises at least one gas, e.g., air.

In some embodiments according to the fifth aspect of the present inventive subject matter, the fluid comprises at least one liquid.

According to a sixth aspect of the present inventive subject matter, there is provided a method of cooling a lighting device comprising:

moving a diaphragm from a first diaphragm position to a second diaphragm position; and cooling a lighting device.

In some embodiments according to the sixth aspect of the present inventive subject matter, a volume within a chamber of the diaphragm is larger when the diaphragm is in one of the first and second diaphragm positions than when the diaphragm is in the other of the first and second diaphragm positions, and a pressure within the chamber is reduced when the volume within the chamber is enlarged, the chamber is positioned adjacent to one surface of a substrate, and at least one solid state light emitter is mounted on another surface of the substrate.

In some embodiments according to the sixth aspect of the present inventive subject matter, the method further comprises:

opening at least one valve of the diaphragm and moving the diaphragm from the second diaphragm position to the first diaphragm position after the moving the diaphragm from the first diaphragm position to the second diaphragm position; and then closing the valve.

The expression "moving the diaphragm", as used herein, encompasses applying a force to cause the diaphragm to move, allowing the diaphragm to move (e.g., as a result of shape memory and/or springs) and combinations thereof.

In some embodiments according to the sixth aspect of the present inventive subject matter, the chamber is defined by an internal chamber surface, and the chamber surface comprises at least a portion of a substrate and at least a portion of an internal surface of the diaphragm.

According to a seventh aspect of the present inventive subject matter, there is provided a lighting device comprising:

a housing;

at least one solid state light emitter, the solid state light emitter being positioned within the housing, the solid state light emitter being movable relative the housing between at least a first position and a second position.

In some embodiments according to the seventh aspect of the present inventive subject matter, the solid state light emitter comprises at least one layer which substantially prevents liquid from passing therethrough.

According to an eighth aspect of the present inventive subject matter, there is provided a method of cooling a lighting device comprising:

moving a solid state light emitter relative to a housing between a first position and a second position, the solid state light emitter being positioned within the housing; and cooling the solid state light emitter.

In some embodiments according to the eighth aspect of the present inventive subject matter, the solid state light emitter comprises at least one layer which substantially prevents liquid from passing therethrough.

The inventive subject matter may be more fully understood with reference to the accompanying drawings and the following detailed description of the inventive subject matter.

BRIEF DESCRIPTION OF THE DRAWING FIGURES

Figure 7:
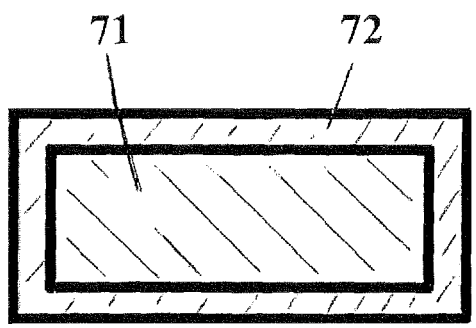

FIG. 7 schematically depicts a solid state light emitter 71 and a layer 72 that surrounds the solid state light emitter 71.

DETAILED DESCRIPTION OF THE INVENTIVE SUBJECT MATTER

The present inventive subject matter now will be described more fully hereinafter with reference to the accompanying drawings, in which embodiments of the inventive subject matter are shown. However, this inventive subject matter should not be construed as limited to the embodiments set forth herein. Rather, these embodiments are provided so that this disclosure will be thorough and complete, and will fully convey the scope of the inventive subject matter to those skilled in the art. Like numbers refer to like elements throughout. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

When an element such as a layer, region or substrate is referred to herein as being "on" or extending "onto" another element, it can be directly on or extend directly onto the other element or intervening elements may also be present. In contrast, when an element is referred to herein as being "directly on" or extending "directly onto" another element, there are no intervening elements present. Also, when an element is referred to herein as being "connected" or "coupled" to another element, it can be directly connected or coupled to the other element or intervening elements may be present. In contrast, when an element is referred to herein as being "directly connected" or "directly coupled" to another element, there are no intervening elements present. In addition, a statement that a first element is "on" a second element is synonymous with a statement that the second element is "on" the first element.

Although the terms "first", "second", etc. may be used herein to describe various elements, components, regions, layers, sections and/or parameters, these elements, components, regions, layers, sections and/or parameters should not be limited by these terms. These terms are only used to distinguish one element, component, region, layer or section from another region, layer or section. Thus, a first element, component, region, layer or section discussed below could be termed a second element, component, region, layer or section without departing from the teachings of the present inventive subject matter.

Relative terms, such as "lower", "bottom", "below", "upper", "top" or "above," may be used herein to describe one element's relationship to another element as illustrated in the Figures. Such relative terms are intended to encompass different orientations of the device in addition to the orientation depicted in the Figures. For example, if a device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the Figure. Similarly, if the device in one of the Figures is turned over, elements described as "below" or "beneath" other elements would then be oriented "above" the other elements. The exemplary terms "below" or "beneath" can, therefore, encompass both an orientation of above and below.

The expression "lighting device", as used herein, is not limited, except that it is capable of emitting light. That is, a lighting device can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or backlighting (e.g., back light poster, signage, LCD displays), bulb replacements (e.g., for replacing AC incandescent lights, low voltage lights, fluorescent lights, etc.), lights used for outdoor lighting, lights used for security lighting, lights used for exterior residential lighting (e.g., wall mounts, post/column mounts), ceiling fixtures/wall sconces, under cabinet lighting, lamps (e.g., floor and/or table and/or desk), landscape lighting, track lighting, task lighting, specialty lighting, ceiling fan lighting, archival/art display lighting, high vibration/impact lighting—work lights, etc., mirrors/vanity lighting, or any other light emitting device.

As used herein, the term "substantially," e.g., in the expressions "substantially prevents", "substantially flat", "substantially parallel", and "substantially perpendicular", means at least about 95% correspondence with the feature recited, for example:

the expression "substantially prevents", in the context of a solid state light emitter having a structure or layer which is described as substantially preventing liquid from passing, means that if a solid state light emitter element (i.e., an element comprising the structure or layer and a solid state light emitter which it surrounds, e.g., see FIG. 7, which schematically depicts a solid state light emitter 71 and a layer 72 that surrounds the solid state light emitter 71) is submerged in water at 15 psi and 25 degree C. for 24 hours, not more than an amount of water which weights 5% of the weight of the solid state light emitter element would penetrate and remain within the solid state light emitter element;

the expression "substantially flat" means that at least 95% of the points in the surface which is characterized as being substantially flat are located on one of or between a pair of planes which are parallel and which are spaced from each other by a distance of not more than 5% of the largest dimension of the surface;

the expression "substantially parallel" means that two lines (or two planes) diverge from each other at most by an angle of 5% of 90 degrees, i.e., 4.5 degrees; and the expression "substantially perpendicular", as used herein, means that at least 90% of the points in the structure which is characterized as being substantially perpendicular to a reference plane or line are located on one of or between a pair of planes (1) which are perpendicular to the reference plane, (2) which are parallel to each other and (3) which are spaced from each other by a distance of not more than 5% of the largest dimension of the structure.

The expression "adjacent", as used herein, means "nearby" or, in some cases "at". For example, where a fluid flows adjacent to a solid state light emitter, the fluid flows sufficiently close to the solid state light emitter that the solid state light emitter will be cooled at least to some extent by the fluid flow.

The present inventive subject matter further relates to an illuminated enclosure (the volume of which can be illuminated uniformly or non-uniformly), comprising an enclosed space and at least one lighting device according to the present inventive subject matter, wherein the lighting device illuminates at least a portion of the enclosed space (uniformly or non-uniformly).

The present inventive subject matter is further directed to an illuminated area, comprising at least one item, e.g., selected from among the group consisting of a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, etc., having mounted therein or thereon at least one lighting device as described herein.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

Any desired solid state light emitter or emitters can be employed in accordance with the present inventive subject matter. Persons of skill in the art are aware of, and have ready access to, a wide variety of such emitters. Such solid state light emitters include inorganic and organic light emitters. Examples of types of such light emitters include a wide variety of light emitting diodes (inorganic or organic, including polymer light emitting diodes (PLEDs)), laser diodes, thin film electroluminescent devices, light emitting polymers (LEPs), a variety of each of which are well known in the art (and therefore it is not necessary to describe in detail such devices, and/or the materials out of which such devices are made).

The respective light emitters can be similar to one another, different from one another, or any combination (i.e., there can be a plurality of solid state light emitters of one type, or one or more solid state light emitters of each of two or more types).

More specifically, light emitting diodes are semiconducting devices that emit light (ultraviolet, visible, or infrared) when a potential difference is applied across a p-n junction structure. There are a number of well known ways to make light emitting diodes and many associated structures, and the present inventive subject matter can employ any such devices. By way of example, Chapters 12-14 of Sze, Physics of Semiconductor Devices, (2d Ed. 1981) and Chapter 7 of Sze, Modern Semiconductor Device Physics (1998) describe a variety of photonic devices, including light emitting diodes.

The expression "light emitting diode" is used herein to refer to the basic semiconductor diode structure (i.e., the chip). The commonly recognized and commercially available "LED" that is sold (for example) in electronics stores typically represents a "packaged" device made up of a number of parts. These packaged devices typically include a semiconductor based light emitting diode such as (but not limited to) those described in U.S. Pat. Nos. 4,918,487; 5,631,190; and 5,912,477; various wire connections, and a package that encapsulates the light emitting diode. Any of such devices can be used as solid state light emitters according to the present inventive subject matter.

As is well known, a light emitting diode produces light by exciting electrons across the band gap between a conduction band and a valence band of a semiconductor active (light-emitting) layer. The electron transition generates light at a wavelength that depends on the band gap. Thus, the color of the light (wavelength) emitted by a light emitting diode depends on the semiconductor materials of the active layers of the light emitting diode.

A wide variety of luminescent materials (also known as lumiphors or luminophoric media, e.g., as disclosed in U.S. Pat. No. 6,600,175, the entirety of which is hereby incorporated by reference) are well known and available to persons of skill in the art. For example, a phosphor is a luminescent material that emits a responsive radiation (e.g., visible light) when excited by a source of exciting radiation. In many instances, the responsive radiation has a wavelength which is different from the wavelength of the exciting radiation. Other examples of luminescent materials include scintillators, day glow tapes and inks which glow in the visible spectrum upon illumination with ultraviolet light.

Luminescent materials can be categorized as being down-converting, i.e., a material which converts photons to a lower energy level (longer wavelength) or up-converting, i.e., a material which converts photons to a higher energy level (shorter wavelength).

Inclusion of luminescent materials in LED devices has been accomplished in a variety of ways, one representative way being by adding the luminescent materials to a clear or transparent encapsulant material (e.g., epoxy-based, silicone-based, glass-based or metal oxide-based material) as discussed above, for example by a blending or coating process.

For example, one representative example of a conventional light emitting diode lamp includes a light emitting diode chip, a bullet-shaped transparent housing to cover the light emitting diode chip, leads to supply current to the light emitting diode chip, and a cup reflector for reflecting the emission of the light emitting diode chip in a uniform direction, in which the light emitting diode chip is encapsulated with a first resin portion, which is further encapsulated with a second resin portion. The first resin portion can be obtained by filling the cup reflector with a resin material and curing it after the light emitting diode chip has been mounted onto the bottom of the cup reflector and then has had its cathode and anode electrodes electrically connected to the leads by way of wires. A luminescent material can be dispersed in the first resin portion so as to be excited with the light A that has been emitted from the light emitting diode chip, the excited luminescent material produces fluorescence ("light B") that has a longer wavelength than the light A, a portion of the light A is transmitted through the first resin portion including the luminescent material, and as a result, light C, as a mixture of the light A and light B, is used as illumination.

Representative examples of suitable solid state light emitters, including suitable light emitting diodes, luminescent materials, encapsulants, etc., are described in:

U.S. patent application Ser. No. 11/614,180, filed Dec. 21, 2006 (now U.S. Patent Publication No. 2007/0236911), the entirety of which is hereby incorporated by reference as if set forth in its entirety;

U.S. patent application Ser. No. 11/624,811, filed Jan. 19, 2007 (now U.S. Patent Publication No. 2007/0170447), the entirety of which is hereby incorporated by reference as if set forth in its entirety;

U.S. patent application Ser. No. 11/751,982, filed May 22, 2007 (now U.S. Patent Publication No. 2007/0274080), the entirety of which is hereby incorporated by reference as if set forth in its entirety;

U.S. patent application Ser. No. 11/753,103, filed May 24, 2007 (now U.S. Patent Publication No. 2007/0280624), the entirety of which is hereby incorporated by reference as if set forth in its entirety;

U.S. patent application Ser. No. 11/751,990, filed May 22, 2007 (now U.S. Patent Publication No. 2007/0274063), the entirety of which is hereby incorporated by reference as if set forth in its entirety;

U.S. patent application Ser. No. 11/736,761, filed Apr. 18, 2007 (now U.S. Patent Publication No. 2007/0278934), the entirety of which is hereby incorporated by reference as if set forth in its entirety;

U.S. patent application Ser. No. 11/936,163, filed Nov. 7, 2007 (now U.S. Patent Publication No. 2008/0106895), the entirety of which is hereby incorporated by reference as if set forth in its entirety;

U.S. patent application Ser. No. 11/843,243, filed Aug. 22, 2007 (now U.S. Patent Publication No. 2008/0084685), the entirety of which is hereby incorporated by reference as if set forth in its entirety;

U.S. Pat. No. 7,213,940, issued on May 8, 2007, entitled "LIGHTING DEVICE AND LIGHTING METHOD" (inventors: Antony Paul van de Ven and Gerald H. Negley), the entirety of which is hereby incorporated by reference as if set forth in its entirety;

U.S. patent application Ser. No. 11/870,679, filed Oct. 11, 2007 (now U.S. Patent Publication No. 2008/0089053), the entirety of which is hereby incorporated by reference as if set forth in its entirety;

U.S. patent application Ser. No. 12/117,148, filed May 8, 2008 (now U.S. Patent Publication No. 2008/0304261), the entirety of which is hereby incorporated by reference as if set forth in its entirety; and U.S. patent application Ser. No. 12/017,676, filed on Jan. 22, 2008 (now U.S. Patent Publication No. 2009/0108269), entitled "ILLUMINATION DEVICE HAVING ONE OR MORE LUMIPHORS, AND METHODS OF FABRICATING SAME" (inventors: Gerald H. Negley and Antony Paul van de Ven), the entirety of which is hereby incorporated by reference as if set forth in its entirety.

As noted above, a first aspect of the present inventive subject matter is directed to a lighting device comprising at least one solid state light emitter and at least one fan, and a fourth aspect of the present inventive subject matter is directed to a method of cooling a lighting device comprising supplying power to at least one fan and blowing fluid toward at least one solid state light emitter.

As noted above, any desired solid state light emitter or emitters can be employed in accordance with the present inventive subject matter.

The one or more fan(s) can be made of any desired material (or materials), and can be of any desired shape (or shapes).

In general, the one or more fan(s) can be any device which moves fluid. A wide variety of fans are known, including synthetic jets. In many cases, a fan includes at least one baffle (or blade or "vane") which has a comparatively large surface area in at least one dimension relative to its overall volume and/or mass. In many cases, a fan includes at least one baffle or blade that rotates about an axis. The term "fan", as used herein, encompasses devices that move gases, devices that move liquids and devices that move mixtures of gases and liquids.

In some embodiments according to the first aspect of the present inventive subject matter or the fourth aspect of the present inventive subject matter, the lighting device further comprises at least one substrate, the substrate comprises at least a first major surface and a second major surface, the solid state light emitter is mounted on the first major surface, the substrate comprises at least one hole extending from the first major surface to the second major surface, and when power is supplied to the fan, the fan blows fluid through the hole, e.g., from adjacent the second major surface to adjacent the first major surface.

In such embodiments, the substrate can be made of any desired material, and can be of any desired shape.

The expression "major surface" as used herein, means a surface which has a surface area which comprises at least 25% of the surface area of the entire structure, and in some cases at least 40% of the surface area of the entire structure (e.g., each of the top and bottom surfaces of a substantially flat thin substrate having substantially parallel top and bottom surfaces).

In embodiments in which a substrate is provided and the substrate comprises one or more hole(s) extending from a first surface to a second surface, the hole(s) can be of any desired size (or sizes) and can extend in any desired direction, e.g., perpendicular to one or both of the surfaces.

As mentioned above, in some embodiments according to the first aspect of the present inventive subject matter or the fourth aspect of the present inventive subject matter, the lighting device further comprises at least one nozzle having an exit orifice.

Persons of skill in the art are familiar with a wide variety of nozzles, and any desired nozzle can be used according to the present inventive subject matter. The nozzle(s) can be made of any desired material(s) and can be of any desired shape(s).

In some embodiments which include one or more nozzle (s), the nozzle comprises (or each of the nozzles comprise) a structure having at least a first region, a second region and an exit orifice, the first region having a first cross-sectional area, the second region having a second cross-sectional area which is smaller than the first cross-sectional area, and the exit orifice being adjacent the second cross-sectional area, whereby if fluid is forced from the first cross-sectional area into the second cross-sectional area, the fluid passes through the exit orifice at a speed which is greater than the speed it travels through the first cross-sectional area.

Another benefit of using nozzles and/or jets of fluid is the adiabatic temperature changes that occur with the compression and decompression of a fluid. An example of this phenomenon is the temperature of spray that is released from a pressurized container such as an aerosol can. As a fluid is expanded, the temperature of the fluid decreases. Therefore, in accordance with the present inventive subject matter, any area adjacent to a nozzle or aperture from which fluid is expelled will cool, and if such area is thermally connected or part of the lighting device, the lighting device will also cool. In addition, the fluid itself will be cooled and when it interfaces with the lighting device, it will provide a further cooling function to the lighting device. The inlet/or compression part of the process can be thermally isolated from the lighting device. As fluid is compressed, it will increase in temperature and this heat can be removed from the fluid before the fluid is expanded around the lighting device. The compression chamber and the expansion area, when included, can be thermally separated from each other with the use of material(s) having low thermal conductivity such as one or more materials selected from among plastics, polymers, ceramics, etc., in either solid form or as foams.

Fanless air movers can be used to increase a volume of fluid. A source of compressed fluid can be forced through a narrowing nozzle. In accordance with Bernoulli's theorem, this will cause the static pressure to decrease. This jet and associated negative static pressure can be used to induce a larger volume flow in a nozzle.

As mentioned above, in some embodiments according to the first aspect of the present inventive subject matter or the fourth aspect of the present inventive subject matter, the solid state light emitter comprises at least one layer which substantially prevents liquid from passing therethrough. In some of such embodiments, the fluid which is blown by the fan(s) toward the solid state light emitter is liquid, whereby the liquid can come into direct contact with the solid state light emitter, but the solid state light emitter is coated so as to prevent or minimize damage resulting from such contact. Such a layer can make it possible, e.g., for the solid state light emitter (and optionally additional parts of the lighting device) to be immersed in a moving flow of cooling liquid (or gaseous/liquid mixture).

As noted above, a second aspect of the present inventive subject matter is directed to a lighting device comprising:

at least one solid state light emitter, the solid state light emitter being movable between at least a first position and a second position; and at least one baffle, and a fifth aspect of the present inventive subject matter is directed to a method of cooling a lighting device comprising:

moving a solid state light emitter between a first position and a second position.

As noted above, any desired solid state light emitter or emitters can be employed in accordance with the present inventive subject matter.

In some embodiments according to the second aspect of the present inventive subject matter or the fifth aspect of the present inventive subject matter, the solid state light emitter can be mounted on a substrate, and the substrate can be made of any desired material, and can be of any desired shape.

The one or more baffle(s) can be made of any desired material (or materials), and can be of any desired shape (or shapes). In many cases, a baffle has a comparatively large surface area in at least one dimension relative to its overall volume and/or mass. In some embodiments, the baffle comprises (or one or more of the baffles comprise) a structure having a large surface area (e.g., at least as large as, and in some cases, at least three times as large as or five times as large as) relative to one or more other structures in its vicinity (i.e., within a distance less than the largest dimension of the surface area of the baffle).

The movement of the solid state light emitter according to the second aspect of the present inventive subject matter or the fifth aspect of the present inventive subject matter can be any desired movement, and the distance of such movement can be any desired distance (or distances). In some embodiments, the movement is effective to create fluid flow which passes adjacent to the solid state light emitter.

In some embodiments, the movement of the solid state light emitter (and/or a substrate on which the solid state light emitter is mounted) is vibratory, e.g., the solid state light emitter reciprocates between two positions, although it is not necessary that the solid state light emitter move to the same positions during each reciprocation. In such embodiments, the solid state light emitter can be positioned on a vibrating structure, or the solid state light emitter can be the vibrating structure. Persons of skill in the art are familiar with a wide variety of vibrating structures and ways to construct them, and any of such structures can be used according to the present inventive subject matter (e.g., a rotating shaft with an eccentric weight attached thereto).

In some embodiments, the direction of movement of the solid state light emitter is substantially perpendicular to one or more major surfaces of the solid state light emitter (or a substrate on which the solid state light emitter is mounted); in some embodiments, the direction of movement of the solid state light emitter can vary.

As mentioned above, in some embodiments according to the second aspect of the present inventive subject matter or the fifth aspect of the present inventive subject matter, the solid state light emitter comprises at least one layer which substantially prevents liquid from passing therethrough. In some of such embodiments, the movement causes liquid to come into direct contact with the solid state light emitter (e.g., in some embodiments, the solid state light emitter is immersed in liquid in which it is moving), but the solid state light emitter is coated so as to prevent or minimize damage resulting from such contact. Such a layer can make it possible, e.g., for the solid state light emitter (and optionally additional parts of the lighting device) to be immersed in non-moving cooling liquid (or gaseous/liquid mixture) or in a moving flow of cooling liquid (or gaseous/liquid mixture).

As noted above, a third aspect of the present inventive subject matter is directed to a lighting device comprising:

at least one solid state light emitter;

a substrate; and a diaphragm, the diaphragm defining at least one chamber having at least one valve, the solid state light emitter being mounted on the substrate, the chamber being positioned adjacent to the substrate, and a sixth aspect of the present inventive subject matter is directed to a method of cooling a lighting device comprising:

moving a diaphragm from a first diaphragm position to a second diaphragm position, and cooling a lighting device.

As noted above, any desired solid state light emitter or emitters can be employed in accordance with the present inventive subject matter.

In some embodiments according to the third aspect of the present inventive subject matter (or the sixth aspect of the present inventive subject matter, where a substrate is provided), the substrate can be made of any desired material, and can be of any desired shape.

In some embodiments according to the third aspect of the present inventive subject matter or the sixth aspect of the present inventive subject matter, the diaphragm can be made of any desired material, and can be of any desired shape. Persons of skill in the art are familiar with a variety of materials that can be used to make a diaphragm, and any of such materials can be used according to the present inventive subject matter. Representative examples of such materials include elastomers, natural and/or synthetic rubbers (such as butyl rubber or nitrile rubber), polypropylene, neoprene, or metal which is un-coated or coated with a material such as an elastomer. In addition, persons of skill in the art are familiar with a variety of devices and systems (e.g., components other than the diaphragm and/or features of the diaphragm itself, such as shape memory) which can result in the diaphragm moving at least from a first diaphragm position to a second diaphragm position, and persons of skill in the art can readily design a wide variety of devices or systems to provide such movement, and any of such devices and/or systems can be employed in the third and sixth aspects of the present inventive subject matter.

As noted above, in the third aspect of the present inventive subject matter, and in some embodiments according to the sixth aspect of the present inventive subject matter, the chamber (or each chamber) has at least one valve. In such embodiments, the valve can be of any desired type, persons of skill in the art being familiar with a wide variety of suitable valves. In some embodiments, during compression of the chamber, the valve(s) is/are open (or at least partially open) to avoid or reduce increasing pressure, and during expansion of the chamber, the valve(s) is/are closed (or at least partially closed)—de-compressing fluid creates cooling.

As noted above, a seventh aspect of the present inventive subject matter is directed to a lighting device comprising:

a housing; and a solid state light emitter positioned within the housing, the solid state light emitter being movable relative the housing between at least a first position and a second position, and an eighth aspect of the present inventive subject matter is directed to a method of cooling a lighting device comprising:

moving a solid state light emitter relative to a housing between a first position and a second position, the solid state light emitter being mounted within the housing; and cooling the solid state light emitter.

As discussed below, skilled artisans are familiar with a wide variety of arrangements, mounting schemes, power supplying apparatuses, housings and fixtures, and any such arrangements, schemes, apparatuses, housings and fixtures can be employed in connection with the seventh and/or the eighth aspects of the present inventive subject matter.

Any desired solid state light emitter or emitters can be employed in accordance with the seventh and/or the eighth aspect of the present inventive subject matter.

In some embodiments in accordance with the seventh and eighth embodiments, the solid state light emitter can be mounted on a substrate which can be made of any desired material, and can be of any desired shape.

The movement of the solid state light emitter according to the seventh aspect of the present inventive subject matter or the eighth aspect of the present inventive subject matter can be any desired movement, and the distance of such movement can be any desired distance (or distances). In some embodiments, the movement is effective to create fluid flow which passes adjacent to the solid state light emitter.

In some embodiments, the movement of the solid state light emitter is vibratory, e.g., the solid state light emitter reciprocates between two positions, although it is not necessary that the solid state light emitter move to the same positions during each reciprocation. In such embodiments, the solid state light emitter can be positioned on a vibrating structure, or the solid state light emitter can be positioned on a substrate that is in turn positioned on a vibrating structure, or the solid state light emitter can be positioned on a substrate that is the vibrating structure. Persons of skill in the art are familiar with a wide variety of vibrating structures and ways to construct them, and any of such structures can be used according to the present inventive subject matter (e.g., a rotating shaft with an eccentric weight attached thereto).

In some embodiments, the direction of movement of the solid state light emitter is substantially perpendicular to one or more major surfaces of the solid state light emitter; in some embodiments, the direction of movement of the solid state light emitter can vary.

As mentioned above, in some embodiments according to the seventh aspect of the present inventive subject matter or the eighth aspect of the present inventive subject matter, the solid state light emitter comprises at least one layer which substantially prevents liquid from passing therethrough. In some of such embodiments, relative movement causes liquid to come into direct contact with the solid state light emitter, but the solid state light emitter is coated so as to prevent or minimize damage resulting from such contact.

The lighting devices of the present inventive subject matter can be supplied with electricity in any desired manner. Skilled artisans are familiar with a wide variety of power supplying apparatuses, and any such apparatuses can be employed in connection with the present inventive subject matter. The lighting devices of the present inventive subject matter can be electrically connected (or selectively connected) to any desired power source, persons of skill in the art being familiar with a variety of such power sources.

Representative examples of apparatuses for supplying electricity to lighting devices and power supplies for lighting devices, all of which are suitable for the lighting devices of the present inventive subject matter, are described in:

U.S. patent application Ser. No. 11/626,483, filed Jan. 24, 2007 (now U.S. Patent Publication No. 2007/0171145), the entirety of which is hereby incorporated by reference as if set forth in its entirety;

U.S. patent application Ser. No. 11/755,162, filed May 30, 2007 (now U.S. Patent Publication No. 2007/0279440), the entirety of which is hereby incorporated by reference as if set forth in its entirety;

U.S. patent application Ser. No. 11/854,744, filed Sep. 13, 2007 (now U.S. Patent Publication No. 2008/0088248), the entirety of which is hereby incorporated by reference as if set forth in its entirety;

U.S. patent application Ser. No. 12/117,280, filed May 8, 2008 (now U.S. Patent Publication No. 2008/0309255), the entirety of which is hereby incorporated by reference as if set forth in its entirety; and U.S. Patent Application No. 61/039,926, filed Mar. 27, 2008, the entirety of which is hereby incorporated by reference as if set forth in its entirety.

The lighting devices of the present inventive subject matter can be arranged, mounted and supplied with electricity in any desired manner, and can be mounted on any desired housing or fixture. Skilled artisans are familiar with a wide variety of arrangements, mounting schemes, power supplying apparatuses, housings and fixtures, and any such arrangements, schemes, apparatuses, housings and fixtures can be employed in connection with the present inventive subject matter.

For example, fixtures, other mounting structures, mounting schemes, power supplying apparatuses, housings, fixtures and complete lighting assemblies which may be used in practicing the present inventive subject matter are described in:

U.S. patent application Ser. No. 11/613,692, filed Dec. 20, 2006 (now U.S. Patent Publication No. 2007/0139923), the entirety of which is hereby incorporated by reference as if set forth in its entirety;

U.S. patent application Ser. No. 11/613,733, filed Dec. 20, 2006 (now U.S. Patent Publication No. 2007/0137074), the entirety of which is hereby incorporated by reference as if set forth in its entirety;

U.S. patent application Ser. No. 11/743,754, filed May 3, 2007 (now U.S. Patent Publication No. 2007/026,3393), the entirety of which is hereby incorporated by reference as if set forth in its entirety;

U.S. patent application Ser. No. 11/755,153, filed May 30, 2007 (now U.S. Patent Publication No. 2007/0279903), the entirety of which is hereby incorporated by reference as if set forth in its entirety;

U.S. patent application Ser. No. 11/856,421, filed Sep. 17, 2007 (now U.S. Patent Publication No. 2008/0084700), the entirety of which is hereby incorporated by reference as if set forth in its entirety;

U.S. patent application Ser. No. 11/859,048, filed Sep. 21, 2007 (now U.S. Patent Publication No. 2008/0084701), the entirety of which is hereby incorporated by reference as if set forth in its entirety;

U.S. patent application Ser. No. 11/939,047, filed Nov. 13, 2007 (now U.S. Patent Publication No. 2008/0112183), the entirety of which is hereby incorporated by reference as if set forth in its entirety;

U.S. patent application Ser. No. 11/939,052, filed Nov. 13, 2007 (now U.S. Patent Publication No. 2008/0112168), the entirety of which is hereby incorporated by reference as if set forth in its entirety;

U.S. patent application Ser. No. 11/939,059, filed Nov. 13, 2007 (now U.S. Patent Publication No. 2008/0112170), the entirety of which is hereby incorporated by reference as if set forth in its entirety;

U.S. patent application Ser. No. 11/877,038, filed Oct. 23, 2007 (now U.S. Patent Publication No. 2008/0106907), the entirety of which is hereby incorporated by reference as if set forth in its entirety;

U.S. Patent Application No. 60/861,901, filed on Nov. 30, 2006, entitled "LED DOWNLIGHT WITH ACCESSORY ATTACHMENT" (inventors: Gary David Trott, Paul Kenneth Pickard and Ed Adams), the entirety of which is hereby incorporated by reference as if set forth in its entirety;

U.S. patent application Ser. No. 11/948,041, filed Nov. 30, 2007 (now U.S. Patent Publication No. 2008/0137347), the entirety of which is hereby incorporated by reference as if set forth in its entirety;

U.S. patent application Ser. No. 12/114,994, filed May 5, 2008 (now U.S. Patent Publication No. 2008/0304269), the entirety of which is hereby incorporated by reference as if set forth in its entirety;

U.S. patent application Ser. No. 12/116,341, filed May 7, 2008 (now U.S. Patent Publication No. 2008/0278952), the entirety of which is hereby incorporated by reference as if set forth in its entirety;

U.S. patent application Ser. No. 12/116,346, filed May 7, 2008 (now U.S. Patent Publication No. 2008/0278950), the entirety of which is hereby incorporated by reference as if set forth in its entirety; and U.S. patent application Ser. No. 12/116,348, filed on May 7, 2008 (now U.S. Patent Publication No. 2008/0278957), the entirety of which is hereby incorporated by reference as if set forth in its entirety.

Embodiments in accordance with the present inventive subject matter are described herein with reference to cross-sectional (and/or plan view) illustrations that are schematic illustrations of idealized embodiments of the present inventive subject matter. As such, variations from the shapes of the illustrations as a result, for example, of manufacturing techniques and/or tolerances, are to be expected. Thus, embodiments of the present inventive subject matter should not be construed as limited to the particular shapes of regions illustrated herein but are to include deviations in shapes that result, for example, from manufacturing. For example, a molded region illustrated or described as a rectangle will, typically, have rounded or curved features. Thus, the regions illustrated in the figures are schematic in nature and their shapes are not intended to illustrate the precise shape of a region of a device and are not intended to limit the scope of the present inventive subject matter.

Figure 1:
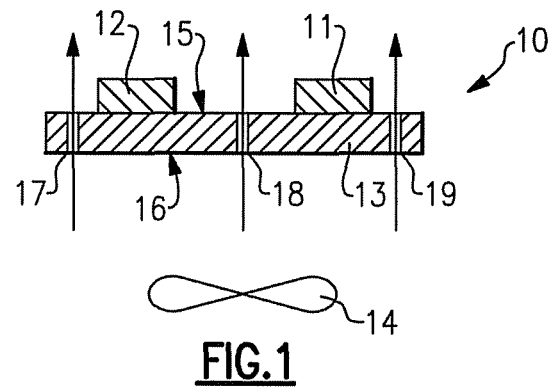
FIG. 1 is a sectional view of a first embodiment of a lighting device according to the present inventive subject matter.

FIG. 1 is a sectional view of a first embodiment of a lighting device according to the present inventive subject matter. The first embodiment corresponds to the first aspect of the present inventive subject matter.

Referring to FIG. 1, the lighting device 10 comprises a first solid state light emitter 11 and a second solid state light emitter 12 (both of which are LEDs) mounted on a substrate 13, and a fan 14. The solid state light emitters 11 and 12 and the fan 14 are positioned relative to one another and the fan 14 is oriented such that when power is supplied to the fan 14, the fan 14 blows air toward the solid state light emitters 11 and 12.

The substrate 13 comprises a first major surface 15 and a second major surface 16, the solid state light emitters 11 and 12 being mounted on the first major surface 15. The substrate 13 comprises a first hole 17, a second hole 18 and a third hole 19, each of the holes 17, 18 and 19 extending from the first major surface 15 to the second major surface 16. When power is supplied to the fan 14, the fan blows fluid through each of the holes 17, 18 and 19 from adjacent the second major surface 16 to adjacent the first major surface 15, thereby cooling the solid state light emitters 11 and 12.

Figure 2:
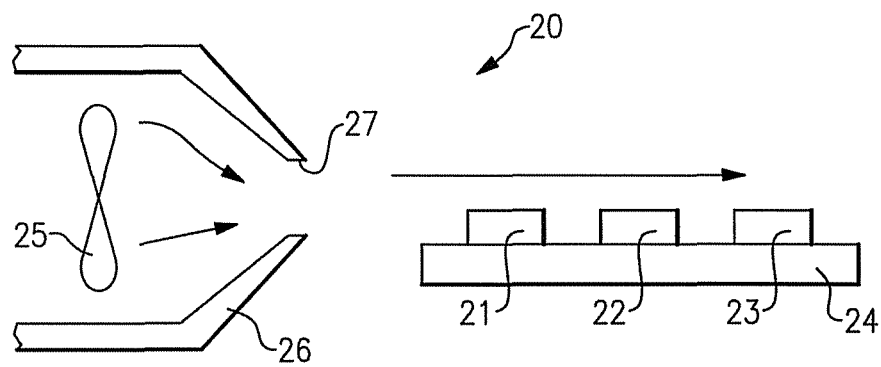
FIG. 2 depicts a second embodiment of a lighting device according to the present inventive subject matter.

FIG. 2 depicts a second embodiment of a lighting device according to the present inventive subject matter. The second embodiment corresponds to the first aspect of the present inventive subject matter.

Referring to FIG. 2, the lighting device 20 comprises a first solid state light emitter 21, a second solid state light emitter 22 and a third solid state light emitter 23 (each of which are LEDs) mounted on a substrate 24, and a fan 25.

The lighting device 20 further comprises a nozzle 26 having an exit orifice 27 which is adjacent to the first solid state light emitter 21. The fan 25 and the nozzle 26 are oriented relative to one another such that when power is supplied to the fan 25, the fan blows air through the exit orifice 27, whereby the fan 25 blows air toward the solid state light emitters 21, 22 and 23.

Figure 3:
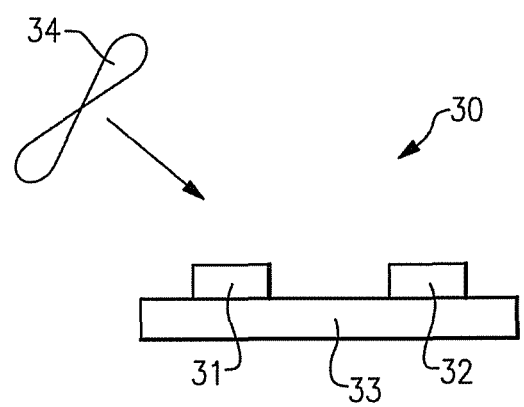
FIG. 3 depicts a third embodiment of a lighting device according to the present inventive subject matter.

FIG. 3 depicts a third embodiment of a lighting device according to the present inventive subject matter. The third embodiment corresponds to the first aspect of the present inventive subject matter.

Referring to FIG. 3, the lighting device 30 comprises a first solid state light emitter 31 and a second solid state light emitter 32 (both of which are LEDs) mounted on a substrate 33, and a fan 34. The solid state light emitters 31 and 32 and the fan 34 are positioned relative to one another and the fan 34 is oriented such that when power is supplied to the fan 34, the fan 34 blows air toward the solid state light emitters 31 and 32.

Figure 4:
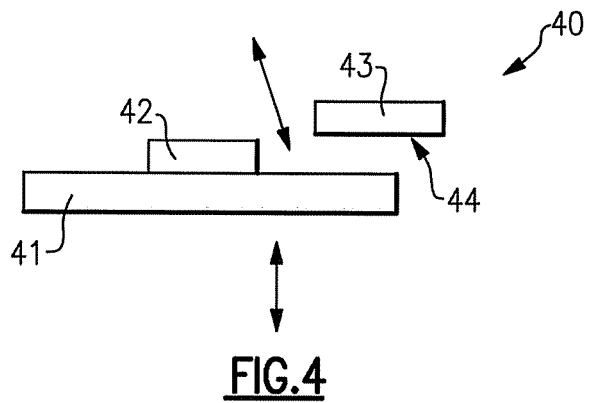
FIG. 4 depicts a fourth embodiment of a lighting device according to the present inventive subject matter.

FIG. 4 depicts a fourth embodiment of a lighting device according to the present inventive subject matter. The fourth embodiment corresponds to the second aspect of the present inventive subject matter.

Referring to FIG. 4, the lighting device 40 comprises a substrate 41, a solid state light emitter 42 and a baffle 43. The solid state light emitter 42 is mounted on the substrate 41. The substrate 41 is movable (in this case, vibratable) between a first substrate position and a second substrate position, such that when the substrate is moved between the first substrate position and the second substrate position, movement of the substrate 41 relative to the baffle 43 creates air flow, the air flow passing adjacent to the solid state light emitter 42. The baffle 43 comprises a first surface 44 which has an area which is larger than a surface area of the solid state light emitter 42.

Figure 5:
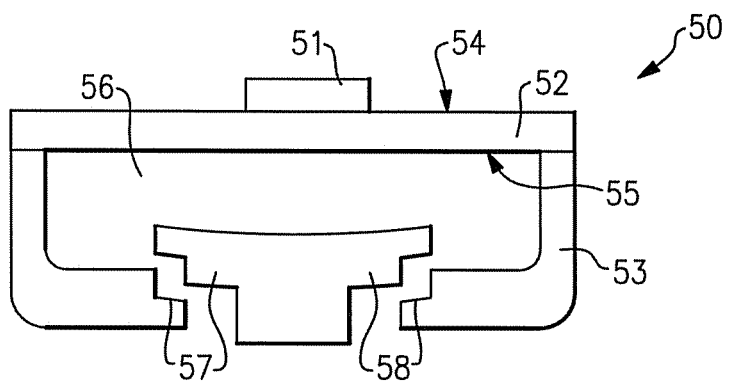
FIGS. 5 and 6 depict a fifth embodiment of a lighting device according to the present inventive subject matter.
Figure 6:
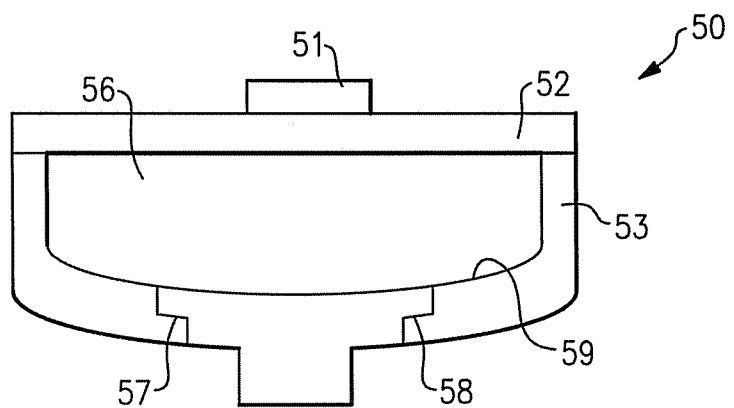

FIGS. 5 and 6 depict a fifth embodiment of a lighting device according to the present inventive subject matter. The fifth embodiment corresponds to the third aspect of the present inventive subject matter.

Referring to FIGS. 5 and 6, the lighting device 50 comprises a first solid state light emitter 51, a substrate 52 and a diaphragm 53. The substrate 52 has a first major surface 54 and a second major surface 55, the first solid state light emitter 51 being mounted on the first major surface 54 of the substrate 52. The diaphragm 53 defines a chamber 56 and has a first valve 57 and a second valve 58. The chamber 56 is adjacent to the second major surface 55 of the substrate 52. Thus, the chamber 56 is defined by an internal chamber surface which comprises a portion of the second major surface 55 and a portion 59 (see FIG. 6) of an internal surface of the diaphragm.

The diaphragm 53 is movable between a first diaphragm position (shown in FIG. 5) and a second diaphragm position (shown in FIG. 6). The volume within the chamber 56 is larger when the diaphragm 53 is in the second diaphragm position than when the diaphragm is in the first diaphragm position.

In operation, the diaphragm 53 moves and/or is moved to the first diaphragm position with the valves 57 and 58 open (FIG. 5 shows the diaphragm 53 in the first diaphragm position with the valves 57 and 58 open), thereby expelling air from within the chamber 56 as the volume within the chamber 56 decreases. After the diaphragm 53 reaches the first diaphragm position, the valves 57 and 58 are closed. At this stage, a relatively small amount of air remains within the chamber 56. Cooling is achieved by causing the chamber 56 to increase in size while maintaining the same amount of air within the chamber (or only allowing a minor amount of air to leak into the chamber), such that the pressure of the air within the chamber decrease, thereby causing cooling. In order to achieve the increase in the size of the chamber and the concomitant reduction in pressure, the diaphragm then moves and/or is moved to the second diaphragm position (with the valves 57 and 58 remaining closed), thereby expanding air within the chamber 56, causing the air to cool. The cooling of the air within the chamber 56 cools the substrate 52, which in turn cools the first solid state light emitter 51. FIG. 6 shows the diaphragm 53 in the second diaphragm position with the valves 57 and 58 closed. After the diaphragm 53 reaches the second diaphragm position, the valves 57 and 58 are opened, and then the diaphragm 53 moves and/or is moved back to the first diaphragm position, thereby completing a cycle.

The movement of the diaphragm 53 (i.e., the diaphragm moves and/or is moved), either from the first diaphragm position to the second diaphragm position or vice-versa, can be achieved in any desired way, e.g., (1) a force can be applied to cause the diaphragm 53 to move, (2) the diaphragm 53 can move on its own (e.g., as a result of shape memory), (3) there can be a combination of a force exerted by the diaphragm itself (e.g., shape memory) and a force being applied to the diaphragm, or (4) one force (or a combination of forces) can overcome another force (or combination of forces), e.g., if the force created by shape memory exceeds a force tending to resist the shape memory force, the shape memory force overcomes the force tending to resist the shape memory force (or vice-versa), whereby the diaphragm moves.

FIG. 7 schematically depicts a solid state light emitter according to one aspect of the present inventive subject matter. Referring to FIG. 7, a solid state light emitter 71 comprises at least one layer 72 which substantially prevents liquid from passing therethrough.

While certain embodiments of the present inventive subject matter have been illustrated with reference to specific combinations of elements, various other combinations may also be provided without departing from the teachings of the present inventive subject matter. Thus, the present inventive subject matter should not be construed as being limited to the particular exemplary embodiments described herein and illustrated in the Figures, but may also encompass combinations of elements of the various illustrated embodiments.

Many alterations and modifications may be made by those having ordinary skill in the art, given the benefit of the present disclosure, without departing from the spirit and scope of the inventive subject matter. Therefore, it must be understood that the illustrated embodiments have been set forth only for the purposes of example, and that it should not be taken as limiting the inventive subject matter as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the inventive subject matter.

Any two or more structural parts of the lighting devices described herein can be integrated. Any structural part of the lighting devices described herein can be provided in two or more parts (which are held together, if necessary). Similarly, any two or more functions can be conducted simultaneously, and/or any function can be conducted in a series of steps.

The invention claimed is:

1. A lighting device comprising:
at least one solid state light emitter; and
at least one fan,
the solid state light emitter and the fan positioned relative to one another and the fan oriented such that when power is supplied to the fan, the fan blows fluid from the fan toward the solid state light emitter, and
at least one layer surrounding the solid state light emitter on all sides of the solid state light emitter, the at least one layer substantially preventing liquid from contacting the solid state light emitter, at least one layer configured to substantially prevent liquid from contacting the solid state light emitter to the extent that if a solid state light emitter element comprising the at least one layer and the solid state light emitter were submerged in water at 15 psi and 25 degrees C. for 24 hours, not more than an amount of water that weighs 5% of the weight of the solid state light emitter would penetrate and remain within the solid state light emitter element.

2. A lighting device as recited in claim 1, wherein:
the lighting device further comprises at least one substrate; and
at least one nozzle, the nozzle having an exit orifice,
the substrate comprises at least a first surface and a second surface,
the solid state light emitter is mounted on the first surface,
the substrate comprises at least one hole extending from the first surface to the second surface,
when power is supplied to the fan, the fan blows fluid from the fan directly through the hole,
the fan and the nozzle are oriented relative to one another such that when power is supplied to the fan, the fan blows fluid through the exit orifice, and
the nozzle comprises a compression chamber and an expansion area.

3. A lighting device as recited in claim 2, wherein when power is supplied to the fan, the fan blows fluid through the hole from adjacent the second surface to adjacent the first surface.

4. A lighting device as recited in claim 2, wherein the fluid comprises at least one gas.

5. A lighting device as recited in claim 2, wherein the fluid comprises at least one liquid.

6. A method of cooling a lighting device, comprising supplying power to at least one fan and blowing fluid toward at least one solid state light emitter, at least one layer surrounding the solid state light emitter on all sides of the solid state light emitter, the at least one layer substantially preventing liquid from contacting the solid state light emitter the at least one layer substantially preventing liquid from contacting the solid state light emitter to the extent that if a solid state light emitter element comprising the at least one layer and the solid state light emitter were submerged in water at 15 psi and 25 degrees C. for 24 hours, not more than an amount of water that weighs 5% of the weight of the solid state light emitter would penetrate and remain within the solid state light emitter element.

7. A method as recited in claim 6, wherein:

said method further comprises supplying power to at least one fan, the lighting device comprises at least one substrate, the substrate comprises at least a first surface and a second surface, a solid state light emitter is mounted on the first surface, the substrate comprises at least one hole extending from the first surface to the second surface, the fan blows fluid from the fan directly through an exit orifice in a nozzle and then through the hole, and the nozzle comprises a compression chamber and an expansion area.

8. A method as recited in claim 7, wherein the fan blows fluid through the hole from adjacent the second surface to adjacent the first surface.

9. A method as recited in claim 7, wherein the method further comprises immersing the solid state light emitter and the layer in a moving flow of cooling liquid.

10. A method as recited in claim 7, wherein the fluid comprises at least one gas.

11. A method as recited in claim 10, wherein the fluid comprises at least one liquid.

* * * * *

UNITED STATES PATENT AND TRADEMARK OFFICE
CERTIFICATE OF CORRECTION

PATENT NO. : 8,950,910 B2
APPLICATION NO. : 12/411905
DATED : February 10, 2015
INVENTOR(S) : Antony Paul Van De Ven It is certified that error appears in the above-identified patent and that said Letters Patent is hereby corrected as shown below:

In the Claims

Column 20, Claim 6, Line 59:

Please change "liquid from contacting the solid state light emitter the at least" to -- liquid from contacting the solid state light emitter, the at least --

Signed and Sealed this
Thirtieth Day of June, 2015

Michelle K. Lee
*Director of the United States Patent and Trademark Office*